United States Patent
Pourrahimi

(10) Patent No.: US 9,714,992 B2
(45) Date of Patent: Jul. 25, 2017

(54) VERSATILE SUPERCONDUCTING MAGNET FOR EXTREMITIES MAGNETIC RESONANCE IMAGING

(71) Applicant: Shahin Pourrahimi, Brookline, MA (US)

(72) Inventor: Shahin Pourrahimi, Brookline, MA (US)

(*) Notice: Subject to any disclaimer, the term of this patent is extended or adjusted under 35 U.S.C. 154(b) by 0 days.

(21) Appl. No.: 14/161,692

(22) Filed: Jan. 23, 2014

(65) Prior Publication Data
US 2015/0226817 A1    Aug. 13, 2015

(51) Int. Cl.
*G01R 33/3815* (2006.01)
*G01R 33/38* (2006.01)

(52) U.S. Cl.
CPC ...... *G01R 33/3815* (2013.01); *G01R 33/3802* (2013.01); *G01R 33/3804* (2013.01)

(58) Field of Classification Search
CPC ............ G01R 33/3815; G01R 33/3802; G01R 33/3804
See application file for complete search history.

(56) References Cited

U.S. PATENT DOCUMENTS

| | | | | |
|---|---|---|---|---|
| 5,545,997 A | * | 8/1996 | Westphal ............... | A61B 90/36 324/319 |
| 5,592,090 A | * | 1/1997 | Pissanetzky ....... | G01R 33/3806 324/368 |
| 5,633,587 A | * | 5/1997 | Hirumachi .......... | G01R 33/421 324/319 |
| 5,820,623 A | * | 10/1998 | Ng ......................... | A61B 34/70 318/568.11 |
| 6,335,623 B1 | * | 1/2002 | Damadian .............. | A61B 5/055 324/319 |
| 6,396,377 B1 | * | 5/2002 | Ying ......................... | H01F 6/04 335/216 |
| 7,999,548 B1 | * | 8/2011 | Brown ................... | A61B 5/055 324/307 |

(Continued)

OTHER PUBLICATIONS

NPL reference "AMI Superconducting Magnets: Installation, Operation, and Maintenance Instructions" American Magnetics, Inc. (Pub date Sep. 1996).*

*Primary Examiner* — Rodney Bonnette
(74) *Attorney, Agent, or Firm* — Arjomand Law Group, PLLC; Farjam Majd

(57) ABSTRACT

A method, a system, and an article of manufacture are disclosed for obtaining imaging data from human extremities using an Extremities MRI (EMRI) system configured to accommodate both legs of a patient during scanning by providing multiple bores, including a scanning bore and one or more non-scanning bores, deployed within an actively or passively shielded, Cryogen-Free (CF), cooled superconducting electromagnet. In various embodiments, the non-scanning bores are located between field or main coils and shield coils, and the cross sections of the bores may be circular, oval, or any other appropriate and useful geometric shape. The longitudinal axis of extra bores may or may not be parallel to the longitudinal axis of the scanning bore. In various embodiments, the EMRI system may have a passively shielded superconducting magnet in which the other leg may be placed between the outside of a cryostat of the superconducting magnet and the ferromagnetic shield components.

28 Claims, 4 Drawing Sheets

(56) References Cited

U.S. PATENT DOCUMENTS

| | | | | |
|---|---|---|---|---|
| 2003/0210048 A1* | 11/2003 | Riederer | ............ | G01R 33/3415 324/309 |
| 2006/0055406 A1* | 3/2006 | Lvovsky | .............. | G01R 33/381 324/318 |
| 2008/0290870 A1* | 11/2008 | Misic | ................. | G01R 33/3415 324/318 |

* cited by examiner

VERSATILE SUPERCONDUCTING MAGNET FOR EXTREMITIES MAGNETIC RESONANCE IMAGING

CROSS-REFERENCE(S) TO RELATED APPLICATION(S)

This application claims the benefit of the filing date of the U.S. Provisional Patent Application 61/773,472, entitled "Versatile Superconducting Magnet for Extremities MRI," filed on 6 Mar. 2013, under 35 U.S.C. §119(e).

TECHNICAL FIELD

This application relates generally to medical devices. More specifically, this application relates to a method and apparatus for obtaining medical diagnostic images using a multi-bore extremities Magnetic Resonance Imaging (MRI) system.

BRIEF DESCRIPTION OF THE DRAWINGS

The drawings, when considered in connection with the following description, are presented for the purpose of facilitating an understanding of the subject matter sought to be protected.

DETAILED DESCRIPTION

Figure 1:
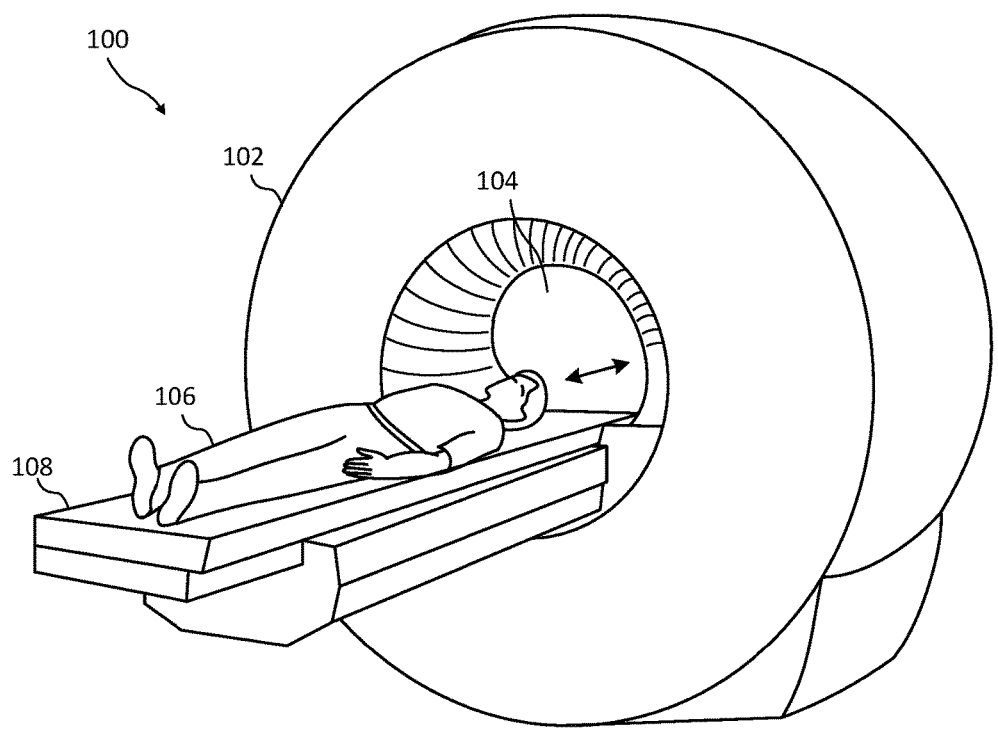
FIG. 1 shows an example arrangement for using a conventional whole-body Magnetic Resonance Imaging (MRI) system for medical diagnostics.

While the present disclosure is described with reference to several illustrative embodiments described herein, it should be clear that the present disclosure should not be limited to such embodiments. Therefore, the description of the embodiments provided herein is illustrative of the present disclosure and should not limit the scope of the disclosure as claimed. In addition, while the following description references application of multi-bore MRI system to human limbs, it will be appreciated that the disclosure may apply to other MRI applications such as human head, animal diagnostics and research, non-medical and/or industrial applications, and the like.

Briefly described, a method, a system, and an article of manufacture are disclosed for obtaining imaging data from human extremities using an Extremities MRI (EMRI) system configured to accommodate the stretching out of both legs of a patient during the scanning of one of his/her legs by providing multiple bores, including a scanning bore and one or more non-scanning bores, deployed within an actively or passively shielded, Cryogen-Free (CF), conduction-cooled superconducting magnet. In various embodiments, the extra non-scanning bores may be located between field coils and shield coils, and the cross sections of the extra bores may be circular, oval, or any other appropriate and useful geometric shape. The extra bores may or may not be parallel to the scanning bore. In various embodiments, the EMRI system may have a passively shielded superconducting magnet in which the other leg may be placed between the outside of a cryostat of the superconducting magnet and the ferromagnetic shield components. In various embodiments, the EMRI machine may be attached to an articulating arm to allow the easy adjustment of the position and orientation of the EMRI machine.

MRI is a technique for accurate and high-resolution visualization of interior of animal tissues. This technique is based on the nuclear magnetic resonance (NMR) property. MRI is often implemented in the form of a scanning device or scanner in which the patient lies horizontally within a scanning bore (see FIG. 1) of sufficient size to accommodate the whole body of the patient. The scanning bore is surrounded by various devices including a magnet generating a powerful static magnetic field that surrounds the patient lying within the scanning bore. The static magnetic field aligns atomic nuclei in the patient's tissues in a particular direction. Then, Radio Frequency (RF) and gradient magnetic fields are applied to alter the alignment induced by the static field. The interference of the gradient fields with the static field causes the nuclei in the tissues to produce a rotating magnetic field detectable by the MRI scanner. Open MRI machines are also used for some applications in which patient is situated between two magnetic components, usually on top and bottom with open sides, instead of a cylindrical bore completely enclosing a section of the patient's body on all sides.

The MRI image is subsequently constructed with computer software based on the detected changes in the magnetic field. The magnetic field gradients thus applied cause nuclei in various tissues and locations within the body to precess (change in the orientation of the rotational axis of a rotating body) at different rates or speeds. The different precession rates allow spatial information needed to construct an image to be recovered from the measured signals using various mathematical techniques, such as Fourier analysis. By using gradient fields in different directions, two Dimensional (2D) images or 3D volumes can be obtained in any arbitrary orientation.

MRI in part uses the fact that body tissue contains a large proportion of water, and hence protons (Hydrogen nuclei), the orientation of which are aligned in a particular direction when placed within a large static magnetic field. Each water molecule has two hydrogen nuclei or protons. The average magnetic moment of many protons becomes aligned with the direction of the field. Gradient coils are used to produce a momentary RF current to generate a varying electromagnetic field with a resonance frequency, which changes or flips the spin of the protons. After the gradient coils are turned off, the gradient varying magnetic field disappears causing the spins of the protons to return to their original states and be re-aligned with the static magnetic field. This return to original spin state is called relaxation. During this relaxation, an RF signal is generated by the change in the spin, which can be measured by instruments such as receiver coils. Thus, 3D information about the origin of the signal in the body may be obtained by applying additional gradient magnetic fields. These additional gradient magnetic fields may be applied to generate signals only from specific locations in the body (spatial excitation) and/or to make magnetization at different spatial locations precess at different frequencies, which allows k-space (k-space is the 2D or 3D Fourier transform of the MR image) encoding of spatial information. The 3D images obtained in MRI can be rotated along arbitrary orientations and manipulated by the medical professional to detect changes of structures within the body.

Protons in different tissues return to their original equilibrium state within the static magnetic field at different relaxation rates. Different tissue variables, including spin density, various relaxation times, and flow and spectral shifts, can be used to construct images. By changing the settings on the scanner, contrast may be created between different types of body tissue. MRI may provide better contrast between the different soft tissues of the body, such as the organs, the brain, muscles, the heart, malignant tissues, and other soft tissues compared with other imaging techniques such as Computer Tomography (CT) or X-rays. MRI is also generally safer because unlike CT scan or X-ray, no ionizing radiation is used in MRI, and thus, it is safer from a radiation standpoint. As such, MRI scanners are often used for biomedical research and diagnosis of human disease and disorder.

Imaging by an MRI scanner requires a very uniform, constant, and stable magnetic field over a specific volume. Conventionally, such a magnetic field, often referred to as a $B_0$ field, is produced by a permanent or a superconducting magnet. For human applications, MRI devices that use permanent magnets typically generate a $B_0$ magnetic field of less than one Tesla (T). For higher resolution imaging, superconducting electromagnets producing higher magnetic fields are used. Typically, high resolution human MRI scanners use magnets that generate fields of 1 T or higher. Superconducting MRI magnets that generate a field of higher than 1 T have a cylindrical bore for equipment and patient access. Open MRI machines can also achieve 1 T, but become proportionally large, heavy, and expensive to buy, install, and operate. If the patient bore is large enough to allow for the whole human body to fit through the scanner, it is referred to as a whole body scanner. Such scanners are large and expensive. There are certain other smaller scanners that have smaller bores, allowing the extremities, arms and legs, to fit through. These scanners, referred to as extremities scanners, are smaller and less expensive but offer acceptable scanning over arms and legs. The magnetic fields of superconducting magnets with cylindrical bores are typically generated by a number of solenoid type superconducting coils within the overall superconducting magnet.

Superconducting $B_0$ magnets use coils that need to be maintained at cryogenic temperatures that are lower than the critical temperature of the superconducting coils to allow superconductor mode of the coil material to appear, in which electrical resistance is zero. To achieve this, conventionally, the coils of a superconducting MRI magnet operate in a pool of liquid helium, at close to atmospheric pressure, that keeps the coils at about 4.2 K.

An alternative to operating MRI superconducting coils in a pool of liquid helium is to cool the coils by a cryocooler that is physically connected to the coils by solid materials that conduct heat away from the coils. Conventionally, these types of magnets are called cryogen-free (CF) or conduction cooled magnets.

One of the customary methods of achieving a substantially constant magnetic field is to operate the superconducting magnet of an MRI system in a "Persistent Mode," in which mode the current circulates, almost perpetually, without applying further power, through a substantially zero-resistance closed-loop set of coils. The advantage of the persistent mode is the constancy of the magnetic field, which is better than what can be achieved in a normal, driven, or non-persistent mode of operation (in which mode power is applied to maintain the current), even with the best regulated power supplies. Furthermore, in the persistent mode no additional energy is needed to power the windings and, therefore, the power supply can be turned off.

In an actively shield MRI superconducting electromagnet operating in persistent mode all field coils and shielding coils, as well as the persistent mode switch coil, are connected in series by superconducting electrical joints. The shield coils, however, are connected to the rest of coils such that the sense of the currents (direction of current flow) in the shielding coils are opposite those of the other coils.

To switch the superconducting magnet from the driven mode into the persistent mode, after energizing the magnet, a "Persistent Mode Switch" may be used. For MRI magnet application a persistent mode switch is typically a non-inductive coil, or switch coil, made from special superconducting wires. When the temperature of the switch coil is below its critical superconducting temperature, the coil is in superconducting state with practically zero resistance, and when the temperature of the switch coil is above its critical temperature the switch coil is in normal (non-superconducting) state and has resistance, for example 10 to 1000 ohms. In a typical MRI superconducting magnet a suitable switch coil with proper normal state resistance is connected to the coils of the magnet such that the switch coil and the magnet coils form a closed loop.

For safety reasons, MRI scanners are used and operated within an area where the magnetic field outside of the area is less than 5 Gauss. The area inside of the 5 Gauss line is sometimes called the MRI magnet's 5-Gauss footprint. For reasons of efficiency and installation cost, superconducting magnets used in MRI applications are magnetically shielded to minimize the 5-Gauss footprint. MRI superconducting magnets may be shielded actively or passively. Actively shielded MRI superconducting magnets are often comprised of main field coils that generate the uniform static magnetic field of higher than 1 T in the area of the geometric center of the magnet systems. Another one or more shielding coils are deployed on the outside of and enclosing or surrounding the field coils to reduce the magnetic footprint of the overall magnetic system by reducing the distance from the core of the machine at which the magnetic field drops to 5 Gauss or less. The sense or direction of the electrical current in the shielding coils is opposite to the sense of the current in the field coils to induce a magnetic field that reduces or cancels the magnetic field created by the static field outside the MRI scanner. Passively shielded MRI magnets have a set of superconducting main coils and ferromagnetic materials placed strategically on the outside of the superconducting magnet to reduce external magnetic field. In various embodiments, shielding of an MRI magnet may be provided by a combination of active coils and passive ferromagnetic materials.

It is noteworthy to recognize that whether an MRI magnet is shielded actively or passively, there is radial space between the field coils and the shielding coils or the ferromagnetic shields.

Often, in actively shielded MRI superconducting magnets, the field coils and shield coils are placed in the same cryogenic vessel (cryostat). While there is radial space between the field coils and the shield coils, magnet designers tend to minimize the radial space so the overall diameter of the cryostat is minimized. The higher the desired magnetic field in the scanning bore of the MRI, the bigger the magnet, and the bigger the magnet diameter, the more difficult to position the other leg comfortably.

In addition to the superconducting magnet, an MRI scanner has a number of other hardware components such as gradient coils, RF coils, and electronics that are not discussed herein. It is the design and the architecture of the superconducting magnet that has the primary impact on patient comfort in an extremities MRI scanner.

FIG. 1 shows an example arrangement for using a Magnetic Resonance Imaging (MRI) system for medical diagnostics. Typically, a diagnostic arrangement 100 includes a whole body MRI scanner 102 having a scanning bore 104, which is a tunnel-like opening, to accommodate the whole body of a patient 106 lying on a bed 108. The bed 108 slides into the opening 104 to position the appropriate portion of the patient's body within the MRI magnet system to start the scanning process.

It is estimated that more than about seven million wrist, elbow, knee, and ankle MRI scans were performed in the United States in 2010. This category of scans accounts for 24% of the total number of scans performed in 2010, making it the third largest MRI application after head (29%) and spine (25%) scans. Trauma, arthritis, joint and ligament problems are among the main reasons for performing extremity MRI scans.

Conventionally, extremity scans are performed with the use of whole body machines located in hospitals or outpatient clinics. Patients are required to remain motionless in a whole body machine for a considerable amount of time, even though it is solely the knee, wrist, or other extremity that is being scanned. The use of whole body scanners is inevitable in most MRI applications, but, in the case of extremities MRI, a smaller, dedicated extremity scanner could bring benefits to patients and scanner owners. These benefits may be more significant among elderly patients, who may be subject to considerably less discomfort, and among pediatric patients, who would benefit from lower anxiety and from the proximity of their caregivers during the procedure.

Another benefit may be derived for patients and their doctors if such a scanner was a point-of-care-instrument that allowed for more timely diagnosis and for follow-up image evaluations during a patient's appointment at the doctor's office, rather than in a hospital setting.

A further cost and inconvenience associated with large full-body MRI scanners is that their size and weight precludes them from being suitable for small medical clinics, doctor's offices, and other non-hospital settings because of the special cooling, power, and housing requirements for large machines.

Some medical manufacturers have produced extremity-dedicated MRI machines. Most of these products use permanent magnets which operate at lower than 1.0 T, and some use actively shielded superconducting electromagnets that go up to a 1.5 T. But the latter may not be regarded as a point-of-care instrument, because it requires maintenance and helium replenishing, and more importantly, it needs appropriate building infrastructure to ventilate a large volume of helium gas in transient conditions. In actively shielded extremities MRI superconducting electromagnets, there has been a desire to minimize the cryostat diameter to allow the non-scanned leg of the patient straddle the MRI scanner when the scanned leg is resting within the scanning bore of the scanner, positioned at a reasonably comfortable orientation (see FIG. 2). Some of such scanners, currently on the market, also do not realistically allow for the scanning of both of the patient's knees, one at a time, meaning the right (or left) knee because, as shown in FIG. 2, the MRI scanning tunnel is asymmetrically located closer to one edge of the machine than the other and there is no place to easily and realistically rest the left leg during the scan, unless the patient is capable of extraordinary flexibility.

A more compact and affordable multi-bore 1.5 T or more extremity MRI scanner, that may use a CF superconducting electromagnet, as disclosed herein, provides significant benefits and advantages to patients, doctors, and equipment owners, especially as a more realistic point-of-care instrument that allows for the scanning of the joints like knee, based on a cryogen-free, and low maintenance magnet, without the need for special facilities or construction.

Additionally, the conventional full-body MRI scanner 102, that generally uses liquid helium, is large, heavy, and expensive, and requires special and extensive construction and facilities including ventilation, plumbing, and safety precautions. Such MRI machines, due to their size and weight, cannot be easily moved through buildings corridors, hallways, doorways, stairways, elevators, and the like to reach its final destination and be installed. In some cases, large cranes are used on the outside a medical building, such as a hospital or a clinic, to lift whole body scanners and position them near the installation room. Then sections of walls and/or windows must be temporarily removed to move the scanner inside the building and then replace the wall or window afterwards. Such moving requirements result in major expenses and inconveniences for the installation. And if the scanner needs to be moved to a different location, all of these processes need to be repeated further adding to the overall cost of operation and ownership. Such considerations are all but absent from a smaller point-of-care machine as disclosed below.

Figure 2:
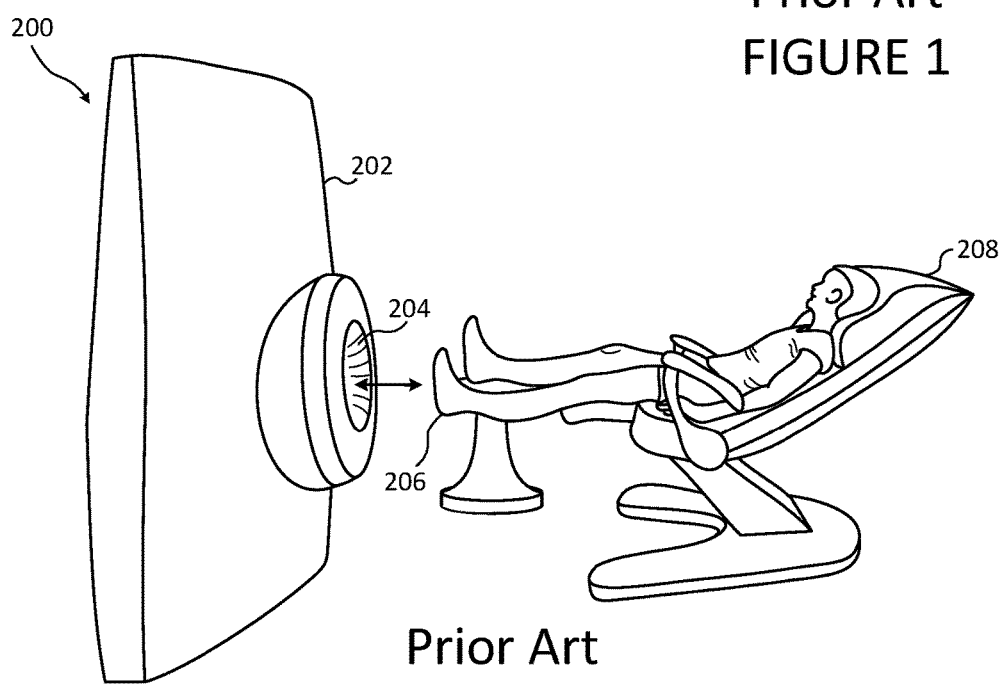
FIG. 2 shows an example arrangement for using an extremities MRI system for medical diagnostics usable with head and limbs of some patients.

FIG. 2 shows an example arrangement for using an extremities MRI system for medical diagnostics usable with head and limbs for some patients. Typically, a diagnostic arrangement 200 includes an Extremity MRI (EMRI) scanner 202 having a scanning bore 204 to accommodate an extremity, such as an arm or a leg of a patient 206 sitting down or lying on a chair 208. The chair 208 is configured to allow the patient's limbs to be in close proximity to the opening 204, shown on the front side of the machine, to position the appropriate extremity of the patient within the MRI magnet to start the scanning process. For small patients, such as infants whose size of head and shoulders are close allowing the shoulder to through the scanning bore, it may be possible to use the extremities MRI system for scanning the head and neck.

In some scanners, the scanning bore is placed close to one side of the MRI scanner 202 at least in part to allow one leg to be placed within the scanning bore while the other leg is placed on the side of the scanner to which the bore is closest. However, this arrangement is not symmetrical and thus does not equally accommodate the patient if his legs were switched on the front side of the machine. For example, in FIG. 2, if the patient's left leg is being scanned, his right leg may be placed on the right side of the scanner to which the bore 204 is closest. But if his right leg is being scanned, then the left leg will have to be pressed against the body of the scanner 202, resulting in a less comfortable experience for the patient. Additionally, moving the patient to the back side of the machine to insert his other leg from the other side of the scanning bore may also not work because the scanning bore is sometimes made to slope downwards with respect to the patient for comfort, thus precluding inserting a leg from the opposite (back) side of the scanning bore to accommodate scanning the other leg. Furthermore, the back of the machine is cluttered with wires, cables, plumbing, attachments, and other peripheral equipment further precluding inserting limbs from the back side of the machine.

Additionally, The EMRI 202, even though smaller than the whole body MRI shown in FIG. 1, may still use liquid helium often needing special facilities for installation and use. And for installation, at least some of the expense and inconveniences associated with full body scanners, as described above, apply to EMRI machines currently on the market.

Figure 3:
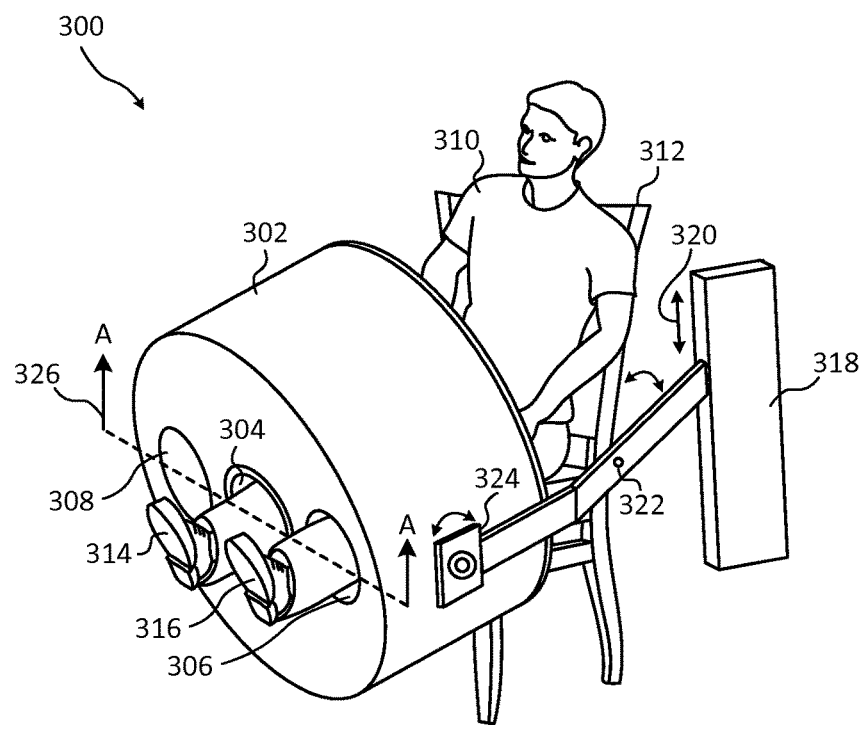
FIG. 3 shows an example arrangement for using a multi-bore extremities MRI system for medical diagnostics usable with head and limb of some patients.

FIG. 3 shows an example arrangement for using a multi-bore extremities MRI system for medical diagnostics usable with head and limb of a broader group of patients than the scanner shown in FIG. 2. In various embodiments, diagnostic arrangement 300 includes EMRI scanner body 302 having a scanning bore 304 through which limb 314 of patient 310 sitting on chair 312 passes, and two non-scanning comfort bores 306 and 308 on either side of the scanning bore 304, through which the other non-scanned leg 316 passes. In various embodiments, scanner 302 may be attached to an articulating arm 322 attached at a pivot point 324 at one end and to a rigid structure 318 at the other end for support. The articulating arm may provide sufficient degrees of freedom for desired placement of the scanner with respect to the patient, as signified by arrows 320 and other curved arrows indicating rotational motion of the articulating arm.

In various embodiments, the scanning bore and the extra non-scanning bores may have cross sections which are circular, oval, or any other appropriate and useful geometric shape. A centerline of the extra bores may or may not be parallel to the centerline of the scanning bore. In some embodiments, one or more of the scanning and non-scanning bores may slant downward to provide better ergonomics and comfort for the patient. The bore cross sections and angles of downward slants may be the same or different in various bores in various embodiments.

In various embodiments, a suitable magnet for creating the static magnetic field in EMRI scanner may be a Cryogen Free (CF) superconducting magnet. Notwithstanding the benefits of installation and overall economy, a CF superconducting magnet offers the option of operating in various tilt orientations of the scanner, including the option where the central scanning bore is vertical. In this case, scanning may be done on a patient in the standing position where parts like knees are bearing weight, as further described with respect to FIG. 5 below. While a CF magnet is preferred, a superconducting magnet that uses liquid helium for cooling may be designed and manufactured to include some of the new features disclosed herein. In various embodiments, cryocooler may be implemented using any refrigeration technique that can provide cryogenic temperatures, typically below 150 Kelvin ("K"). ThermoElectric Coolers (TEC) may be used as part of the refrigeration system. TECs, also known as Peltier coolers, are solid-state heat pumps that operate based on the Peltier effect to move heat and can create a differential temperature of up to 70° centigrade or more. The temperatures reached by a refrigeration system depend largely on material such as the refrigeration gas used, solid state junctions in TECs, and the like. Other cryogenic refrigeration systems include Gifford-Mac Mahan type systems and pulse tubes.

In various embodiments, Superconducting magnets that utilize low temperature superconductors, for example Nb—Ti and $Nb_3Sn$, operate at very low temperatures of 3-15 K. One method of cooling down such a superconducting magnet to these very low temperatures is by using a two-stage cryocooler (also known as a cryo-refrigerator) that makes physical contact with designated parts of the magnet system thereby extracting heat by way of conduction through the connected parts. This method of cooling is commonly referred to as being cryogen free, or conduction cooling. In these embodiments, various components of the cryostat may operate in vacuum.

The amount of cooling (removal of heat) that is provided by a two stage cryocooler can be a few tens of watts for the first stage achieving for example a temperature of 30-60K and a few watts for the second stage achieving 3-6K. Therefore the amount of heat transferred (also known as heat leak) to the superconducting magnet from the environment must be reduced to or be lower than the cooling capacity of the cryocooler.

Heat transfer to a superconducting magnet is by way of convection, radiation and conduction. In the case of a cryogen-free superconducting magnet, convection heat transfer is reduced by housing the superconducting magnet inside a vacuum chamber (vessel), which in this case is referred to as the cryostat. Radiation heat transfer may be reduced by housing the superconducting magnet inside a radiation shield, which in turn may be housed within the vacuum chamber. This radiation shield is cooled by the first stage of the two-stage cryocooler to a temperature of 30-60K, and is generally covered on the side facing the vacuum chamber with several layers of reflective insulation, often referred as super-insulation. Conduction heat transfer may also be reduced by proper material selection and strategic placement of such low-heat conductivity material.

Integrating a cryocooler in a conduction cooled (cryogen-free) device with the EMRI machine, and using it instead of liquid helium, liquid nitrogen, or other cryogens to cool the coils for superconductivity, allows the size, cost, and complexity of the EMRI machine and its installation to be reduced. Additionally, using CF magnets enables and allows various rotations and movements of the EMRI machine as further described below.

In various embodiments, the one or more non-scanning bores may be deployed in the space between the shielding magnetic coils and the scanning or main magnetic coils, as further described with respect to FIG. 4 below. In some embodiments, the non-scanning bore may be replaced by one open annulus.

In some embodiments, a single extra non-scanning bore may be provided in the EMRI to accommodate the non-scanned leg, such as EMRI machine 302 with only bore 306. In such a case, the scanned leg 314 may be placed in the center scanning bore 304, while the other leg 316 may be rested in the single extra bore 306. If the legs are exchanged, then the EMRI scanner's body may be rotated an angular amount, such as 180°, around the longitudinal centerline or axis of the scanning bore (parallel to the patient's scanned leg), or around the vertical axis of the EMRI machine 302 (an axis which is perpendicular to the longitudinal centerline or axis of the scanning bore 304) to accommodate the other leg. In other embodiments, chair 312 or an extra chair may be placed on the opposite side of EMRI machine 302 for the patient 310 to sit and scan leg 316 in the scanning bore 304, while resting leg 314 in extra bore 306.

In other embodiments, two extra non-scanning bore may be provided to avoid having to rotate the EMRI machine, as described above.

In various embodiments, the articulating support and positioning arm 322 may be attached to a rigid post fastened to the floor, while in other embodiments, the articulating arm may attached to the ceiling. For complete freedom of positioning and rotating the EMRI machine in 3D space, several, for example seven, degrees of freedom may be needed in the arm and/or its attachment point to the EMRI machine. However, if all possible types of rotation or positioning are not needed, then a simpler articulating arm providing only the needed motions for the EMRI machine may be used. For example, if two side bores (non-scanning) are provided, then there may be no need for the ability to rotate the EMRI machine around its center bore's axis and one degree of freedom may be thus eliminated to reduce costs and also simplify the system.

Such articulating arm supporting the EMRI machine allows easily positioning it in various positions and orientations as needed by the medical staff at the point and time of usage, without altering the installation of the EMRI machine or other undue and burdensome efforts, to best serve the patient. The position is defined as a point in the volume reachable by the arm, while the orientation is the angle of the longitudinal centerline through the tunnel-like or cylindrical scanning bore of the EMRI device with respect to a particular reference frame, such as that defined by the rigid structure 318 as the origin of the reference frame. For example, in some diagnostic scenarios, the patient may need to place his weight on his leg during scanning to see how his weight affects his knee joint and/or the soft tissue surrounding the joint. In other scenarios, the patient may need to be seated or lying down for the scan. These scenarios are further described with respect to FIGS. 5 and 6 below.

In various embodiments, the center bore and the side bores may be better understood when viewed looking into cross-section A-A 326 taken from the EMRI machine 302.

Figure 4:
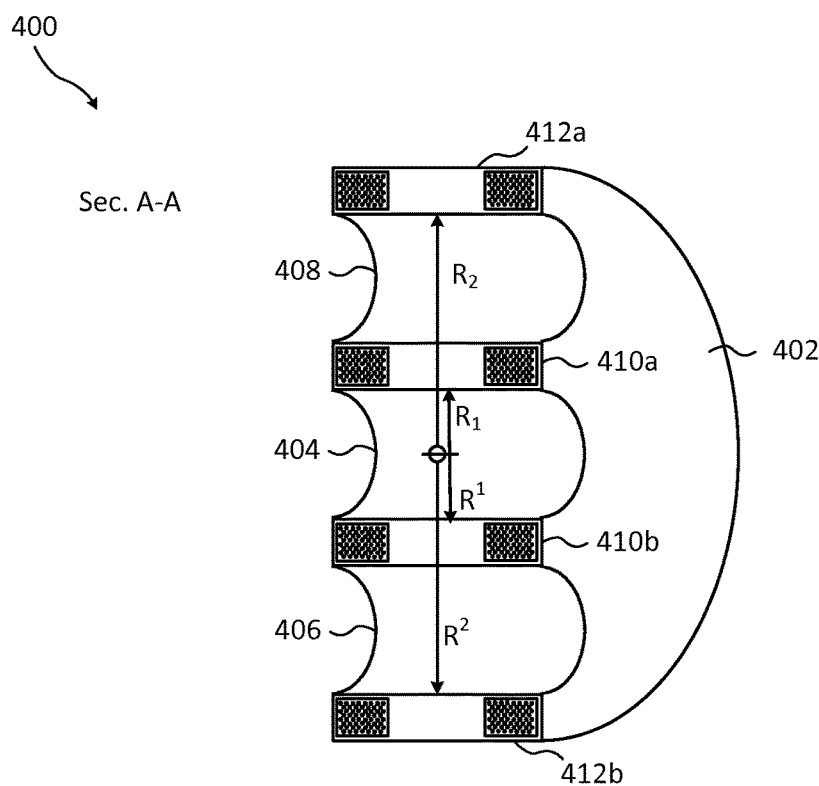
FIG. 4 shows a perspective cross-section A-A of the example arrangement for using a multi-bore extremities MRI system of FIG. 3.

FIG. 4 shows cross-Section A-A of the example arrangement for using a multi-bore extremities MRI system of FIG. 3. In various embodiments, perspective cross-section A-A 400, corresponding to cross-section A-A 326 of FIG. 3, may reveal the internal physical relationship between the scanning coils which generate the powerful scanning and static magnetic field within the scanning bore, the shielding coils which reduce the 5-Gauss footprint for the EMRI machine, and the scanning and non-scanning bores within the EMRI machine. In various embodiments, the body 402 of the EMRI machine may include a scanning bore 404 and two side non-scanning bores 406 and 408 deployed between the scanning or main coils' cross sections 410a and 410b, and the shielding coils' cross sections 412a and 412b. The small dots shown arranged in rectangular formations in the various coils signify cross section of coil wires in some embodiments. Even though in FIG. 4 the cross sections of single coils are shown for each of the main coils and the shielding coils, in practical embodiments, multiple magnetic coils may be deployed for implementing one or more of the electromagnets.

In various embodiments, the center bore coil configured to generate the static powerful magnetic field for aligning the protons in body tissues has a radius of $R_1$ measured from the center of the scanning bore 404, as shown. The cut-away cross-section A-A shows one end of the cross section of wires within the scanning coil 410a continuing to the other end of the cross section 410b. Similarly, the shielding coil configured to generate the static shielding magnetic field, which when combined with the static field (generated by the main/field coil) creates a resultant magnetic field with a reduced size 5-Gauss footprint, has a radius of $R_2$ measured from the center of the scanning bore 404, as shown. The cut-away cross-section A-A shows one end of the cross section of wires within the shielding coil 412a continuing to the other end of the cross section 412b.

Between these two sets of coils, namely, the main (or scanning, or field) coils and the shielding coils, the difference between $R_1$ and $R_2$ provides a space for deploying the side bores 406 and 408, as shown.

In various embodiments, gradient coils, as well as RF coils, are also deployed within the scanning bore around the patent's extremity to affect the scanning, as described above.

In various embodiments, the EMRI magnetic shield may be active as described above, or be passive using a natural or permanent magnet. In other embodiments, the magnetic shield may be a combination of passive and active magnets. In such configurations, the shield may be optimized to reduce the 5-Gauss footprint, and reduce cost and size of the EMRI. In various embodiments, the EMRI system may have a passively shielded superconducting magnet, using a ferromagnet, in which the other (non-scanned) leg may be placed between the outside of the cryostat of the superconducting magnet and the ferromagnetic shield. This resting place may be an open annular space or a bore.

Figure 5:
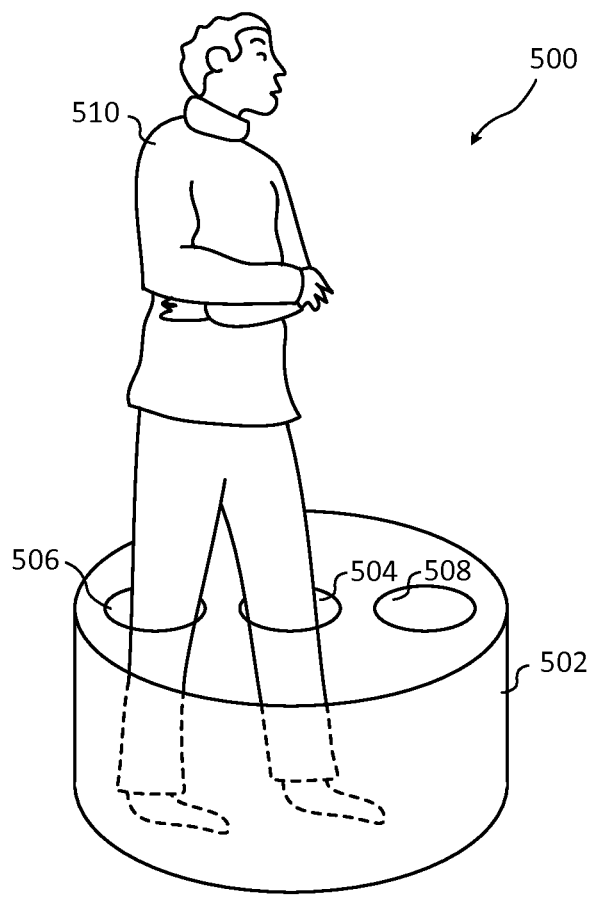
FIG. 5 shows an example application of the multi-bore extremities MRI system of FIG. 3 in a standing or vertical position.

FIG. 5 shows an example application of the multi-bore extremities MRI system of FIG. 3 in a standing or vertical position. In various embodiments, diagnostic arrangement 500 includes patient 510 standing up in a vertical position with one leg passing through the center scanning bore 504 and the other leg in one of the non-scanning side bores 506 and 508 deployed within the EMRI scanner 502.

Figure 6:
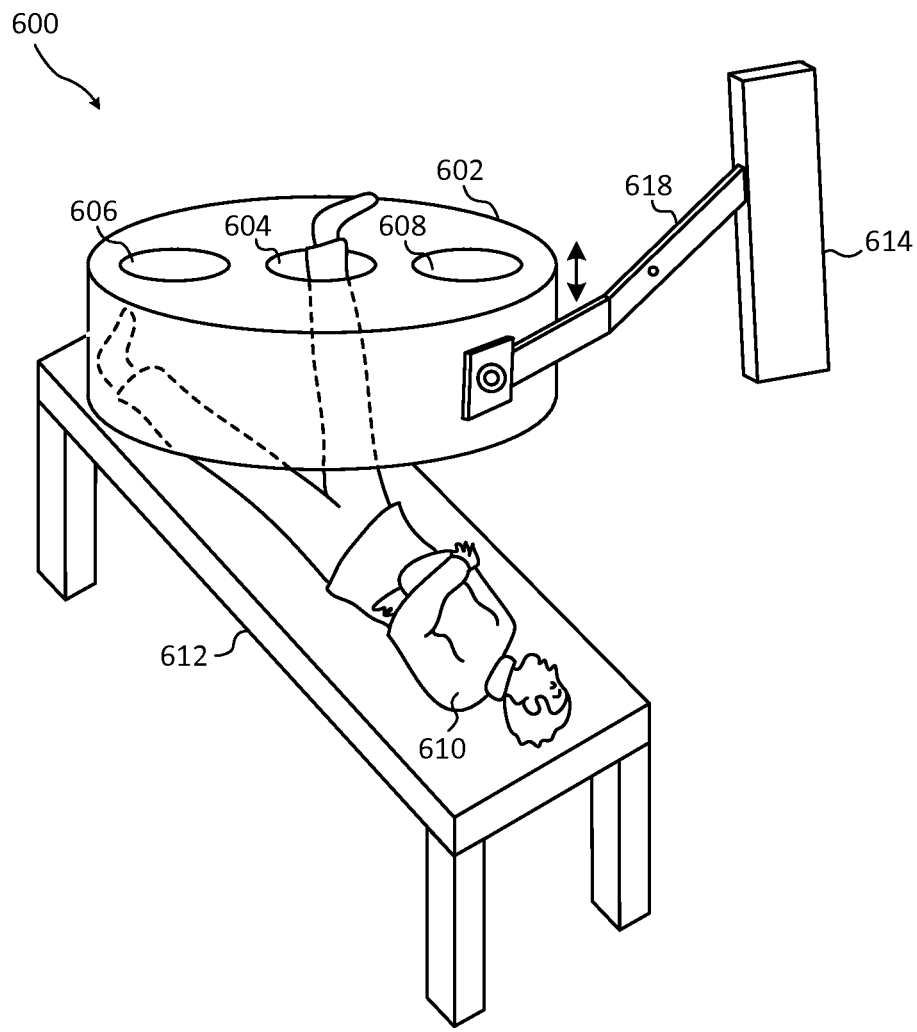
FIG. 6 shows an example application of the multi-bore extremities MRI system of FIG. 3 in a lying down or horizontal position.

In various embodiments, the EMRI scanner may be placed near the floor permanently for vertical scanning or be attached to an articulating arm, as shown in FIG. 3, and be positioned for vertical scanning. The patient may also sit above the EMRI scanner with legs hanging down into the scanning bore for scanning ankles or other lower areas of the leg. FIG. 6 shows an example application of the multi-bore extremities MRI system of FIG. 3 in a lying down or horizontal position. In various embodiments, diagnostic arrangement 600 includes patient 610 lying down on a bed 612 in a horizontal position with one leg passing up through the center scanning bore 604 and the other leg in one of the non-scanning side bores 606 and 608 deployed within the EMRI scanner 602. An articulating arm 618 attached to a rigid support 614 may be attached to support and position the EMRI scanner.

In various embodiments, the EMRI scanner may be placed hanging down near the ceiling permanently for vertical scanning of patient's leg while lying down or be attached to an articulating arm 618, as shown, and be positioned for vertical scanning. The patient may also sit down below the EMRI scanner with arms raised up into the scanning bore for scanning wrists, elbows, or other lower areas of the arm in a raised position. Similarly the head and neck areas may be scanned while the patient is sitting upright.

Various patient positions may bear on the physiological or physical states of his body. Thus, there may be a most suitable position of a patient for obtaining a best diagnosis. For example, scanning while standing up in a weight bearing position may reveal details and injuries and that sitting down without the force of body weight may not reveal. Similarly, with the head upright in a sitting position, the scan may reveal circulatory problems while blood is being pumped up by the heart that may not be revealed as well if the patient is lying down.

Changes can be made to the claimed invention in light of the above Detailed Description. While the above description details certain embodiments of the invention and describes the best mode contemplated, no matter how detailed the above appears in text, the claimed invention can be practiced in many ways. Details of the system may vary considerably in its implementation details, while still being encompassed by the claimed invention disclosed herein.

Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the claimed invention to the specific embodiments disclosed in the specification, unless the above Detailed Description section explicitly defines such terms. Accordingly, the actual scope of the claimed invention encompasses not only the disclosed embodiments, but also all equivalent ways of practicing or implementing the claimed invention.

The above specification, examples, and data provide a complete description of the manufacture and use of the composition of the invention. Since many embodiments of the invention can be made without departing from the spirit and scope of the invention, the invention resides in the claims hereinafter appended. It is further understood that this disclosure is not limited to the disclosed embodiments, but is intended to cover various arrangements included within the spirit and scope of the broadest interpretation so as to encompass all such modifications and equivalent arrangements.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While the present disclosure has been described in connection with what is considered the most practical and preferred embodiment, it is understood that this disclosure is not limited to the disclosed embodiments, but is intended to cover various arrangements included within the spirit and scope of the broadest interpretation so as to encompass all such modifications and equivalent arrangements.

What is claimed is:

1. An Extremities Magnetic Resonance Imaging (EMRI) device comprising:
    a device body having at least two bores deployed therein including a central scanning bore and a side non-scanning bore; and
    a field magnet surrounding the scanning bore, and a shield magnet surrounding the field magnet, the central scanning bore, and the side non-scanning bore.

2. The device of claim 1, further comprising a cryocooler device configured to cool the field magnet.

3. The device of claim 1, wherein the field magnet is Cryogen Free (CF).

4. The device of claim 1, further comprising an articulating arm configured to position the EMRI device in a desired three dimensional space and in a desired orientation.

5. The device of claim 4, wherein the articulating arm is configured to allow a rotation of the device body around a longitudinal centerline of the central scanning bore.

6. The device of claim 1, wherein the field magnet and the shield magnet are superconducting magnets configured to produce a stable and constant magnetic field.

7. The device of claim 6, wherein the coils of the field magnet and the shield magnet are connected in series and operate in persistent mode.

8. The device of claim 7, wherein the side non-scanning bore is configured to receive a body extremity not to be scanned.

9. The device of claim 7, wherein the device has two side non-scanning bores, one on either side of the central scanning bore.

10. The device of claim 7, wherein the side non-scanning bore is not parallel to the central scanning bore.

11. An Extremities Magnetic Resonance Imaging (EMRI) device comprising:
    a device body having at least a central scanning bore and a side non-scanning bore; and
    a field superconducting coil surrounding the scanning bore, and a shield coil surrounding the field superconducting coil, wherein the field superconducting coil is cooled using a cryocooler.

12. The device of claim 11, wherein the field superconducting coil and the shield coil are superconducting magnets configured to produce a stable and constant magnetic field.

13. The device of claim 12, wherein the field superconducting coil and the shield coil are connected in series and operate in persistent mode.

14. The device of claim 13, wherein the shield coil is a superconducting electromagnet that is cooled by the cryocooler.

15. The device of claim 11, further comprising an articulating arm configured to position the EMRI device in a desired three dimensional space and in a desired orientation.

16. The device of claim 15, wherein the articulating arm is configured to allow a rotation of the device body around a longitudinal centerline of the central scanning bore.

17. The device of claim 11, wherein the device has two side non-scanning bores, one on either side of the central scanning bore and wherein the side non-scanning bores are deployed between the shield coil and the field superconducting coil.

18. The device of claim 11, wherein the non-scanning bore is not parallel to the central scanning bore and has a non-circular cross section.

19. The device of claim 11, wherein the scanning bore and the non-scanning bore are slanted down for further comfort of a patient being scanned by the EMRI.

20. The device of claim 11, wherein crycooler is integrated with the device body and is configured to allow the device body to change position and orientation without altering the EMRI device's installation.

21. A method of scanning body extremities, the method comprising:

using an Extremities Magnetic Resonance Imaging (EMRI) device having at least two bores including a central scanning bore and a side non-scanning bore, wherein the side non-scanning bore is configured to receive a non-scanned body extremity;

placing a body extremity to be scanned in the central scanning bore;

placing another body extremity not to be scanned in the side non-scanning bore; and scanning the body extremity to be scanned.

22. The method of claim 21, further comprising orienting a patient's body in an upright position to step into the scanning and non-scanning bores while bearing the patient's weight.

23. The method of claim 21, further comprising orienting a patient's body in a horizontal position and raising a patient's leg to be perpendicular to the patient's body and pass through the central scanning bore while EMRI device is positioned above the patient.

24. The method of claim 21, wherein the EMRI device has two side non-scanning bores, one on either side of the central scanning bore.

25. The method of claim 21, wherein the EMRI device includes a cryogen-free superconducting electromagnet.

26. An Extremities Magnetic Resonance Imaging (EMRI) device comprising:

a device body having at least a central scanning bore and a side non-scanning bore;

a field superconducting coil surrounding the scanning bore; and a shield superconducting coil surrounding the field superconducting coil, wherein the field and the shield superconducting coils operate in a cryogen-free magnet system and are cooled by conduction using a cryocooler.

27. The device of claim 26, wherein the field and shield superconducting coils are configured to produce a stable and constant magnetic field.

28. The device of claim 26, wherein the coils of the field and shield superconducting coils are connected in series and operate in persistent mode.

* * * * *